United States Patent
Sun et al.

(10) Patent No.: US 8,486,282 B2
(45) Date of Patent: Jul. 16, 2013

(54) ACID CHEMISTRIES AND METHODOLOGIES FOR TEXTURING TRANSPARENT CONDUCTIVE OXIDE MATERIALS

(75) Inventors: Zhi-Wen Sun, San Jose, CA (US); Nitin Kumar, Fremont, CA (US); Guizhen Zhang, Santa Clara, CA (US); Minh Anh Nguyen, San Jose, CA (US); Nikhil Kalyankar, San Jose, CA (US)

(73) Assignee: Intermolecular, Inc., San Jose, CA (US)

( * ) Notice: Subject to any disclaimer, the term of this patent is extended or adjusted under 35 U.S.C. 154(b) by 273 days.

(21) Appl. No.: 12/729,199

(22) Filed: Mar. 22, 2010

(65) Prior Publication Data

US 2010/0288725 A1  Nov. 18, 2010

Related U.S. Application Data

(60) Provisional application No. 61/163,445, filed on Mar. 25, 2009.

(51) Int. Cl.
*H01B 13/00* (2006.01)
*B31D 3/00* (2006.01)

(52) U.S. Cl.
USPC ........ 216/13; 216/2; 216/24; 216/56; 216/83; 216/95; 216/99; 216/106; 216/108; 252/79.1; 252/79.2; 252/79.3; 252/79.4

(58) Field of Classification Search
USPC .............. 216/2, 13, 24, 56, 83, 99, 106, 108, 216/95; 252/79.1, 79.2, 79.3, 79.4
See application file for complete search history.

(56) References Cited

U.S. PATENT DOCUMENTS

| | | | | |
|---|---|---|---|---|
| 5,578,141 | A * | 11/1996 | Mori et al. | 136/251 |
| 7,608,547 | B2 * | 10/2009 | Park et al. | 438/745 |
| 2001/0037825 | A1 * | 11/2001 | Nakano et al. | 136/256 |
| 2006/0131267 | A1 * | 6/2006 | Lee et al. | 216/41 |
| 2007/0151944 | A1 * | 7/2007 | Du | 216/24 |
| 2007/0184191 | A1 * | 8/2007 | Takai et al. | 427/255.28 |
| 2007/0278185 | A1 * | 12/2007 | Matsubara et al. | 216/96 |
| 2008/0210660 | A1 * | 9/2008 | Stockum et al. | 216/13 |
| 2009/0194157 | A1 * | 8/2009 | den Boer et al. | 136/256 |

* cited by examiner

*Primary Examiner* — Nadine G Norton
*Assistant Examiner* — Christopher Remavege

(57) ABSTRACT

Surface texturing of the transparent conductive oxide (TCO) front contact of a thin film photovoltaic (TFPV) solar cell is needed to enhance the light-trapping capability of the TFPV solar cells and thus improving the solar cell efficiency. Embodiments of the current invention describe chemical formulations and methods for the wet etching of the TCO. The formulations and methods may be optimized to tune the surface texturing of the TCO as desired.

16 Claims, 6 Drawing Sheets

ACID CHEMISTRIES AND METHODOLOGIES FOR TEXTURING TRANSPARENT CONDUCTIVE OXIDE MATERIALS

FIELD OF THE INVENTION

The present invention relates generally to thin film photovoltaic processing. More specifically, acid chemistries and methods for texturing transparent conductive oxides using the same acid chemistries are described.

BACKGROUND OF THE INVENTION

Currently, the starting substrates and superstrates in many thin film photovoltaic (TFPV) solar cells are made of planer low iron (Fe) float glass on which a transparent conducting oxide (TCO) film is deposited. The TCO film is used to electrically contact one terminal of the TFPV solar cell. Although the planar TCO coated glass does an adequate job in allowing light to enter the cell, it does a poor job in light trapping. One method being employed today to improve light trapping is to texture the TCO film itself. In order to texture the TCO film it needs to be etched. Conventional wet etchants include traditional acids such as hydrochloric acid (HCl), sulfuric acid ($H_2SO_4$), and nitric acid. The etchant may also be a base such as potassium hydroxide, sodium hydroxide, or aluminum hydroxide. In the prior art, a method that produces a textured doped ZnO film consists of wet chemical etching with common acids such as diluted hydrochloric acid (HCl). Other acids that have been reported include sulfuric acid ($H_2SO_4$), nitric acid ($HNO_3$), formic acid (HCOOH), and acetic acid ($CH_3COOH$). In general, a simple chemical etch using 0.5 weight % HCl at room temperature for time duration of 15-45 seconds has been found to produce a surface texture on a TCO. But, many of these wet etchants are not ideal because the ability to control the texture along with the etch rate is a challenge. Additionally, many of these wet etchants are not environmentally friendly.

BRIEF DESCRIPTION OF THE DRAWINGS

Various embodiments of the invention are disclosed in the following detailed description and the accompanying drawings.

DETAILED DESCRIPTION

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

Surface texturing of the transparent conductive oxide (TCO) front contact of a thin film photovoltaic (TFPV) solar cell may be used to enhance the light-trapping capability of the TFPV solar cells and thus improving the solar cell efficiency. Embodiments of the current invention describe chemical formulations and methods for the wet etching of the TCO. The formulations and methods may be optimized to tune the surface texturing of the TCO as desired.

Figure 1:
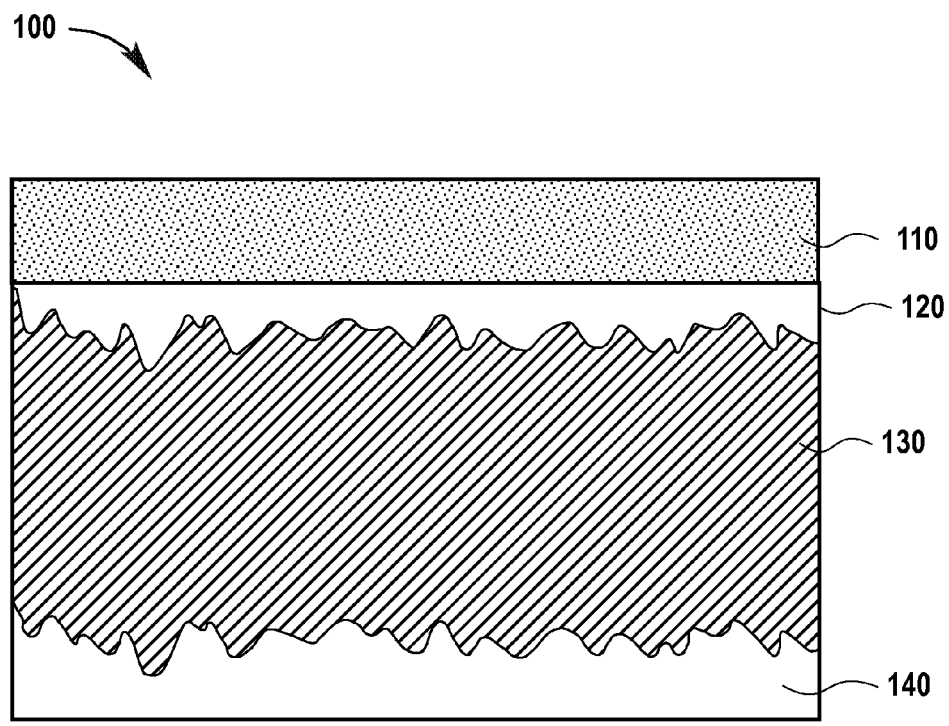
FIG. 1 illustrates a thin film photovoltaic (TFPV) solar cell that includes a textured transparent conductive oxide (TCO) according to an embodiment of the current invention.

FIG. 1 illustrates an example of a TFPV solar cell 100. A transparent superstrate 110, which in most instances will be glass, receives the incident light. A textured TCO 120 is formed on the glass superstrate 110 to function as an electrode. Once textured the TCO 120 enhances the light trapping capability of the solar cell 100. The light trapping may be enhanced because the texturing of the TCO 120 serves the scatter the light at multiple angles either as the light is entering the solar cell 100 or bouncing back upwards after hitting the back of the solar cell 100. A silicon layer 130 is the optical conversion layer where light is transformed into electrical energy. A single layer of silicon 130 is shown for purposes of demonstration, but it is to be understood that the silicon layer 130 may be multiple layers or junctions of silicon of various types such as crystalline silicon, polycrystalline silicon, or amorphous silicon. A back contact electrode 140 completes the basic solar cell 100.

Figure 2:
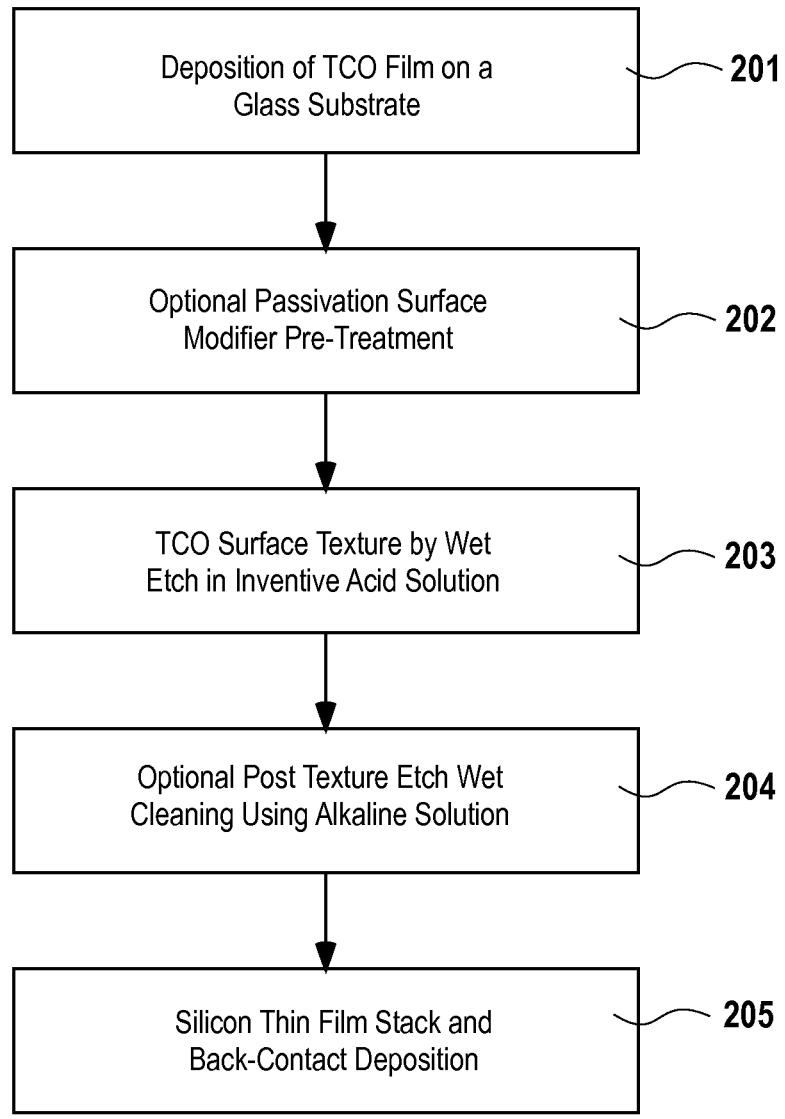
FIG. 2 is a flowchart describing a method of texturing a transparent conductive oxide during the formation of a TFPV solar cell according to an embodiment of the current invention.
Figure 3A:
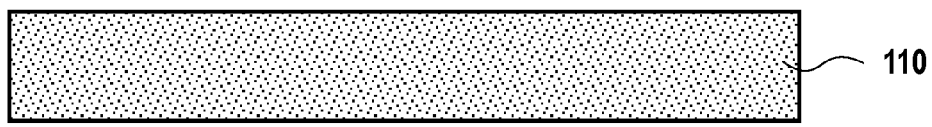
FIGS. 3A-3E illustrate a process flow for forming a TFPV solar cell according to an embodiment of the current invention.
Figure 3B:
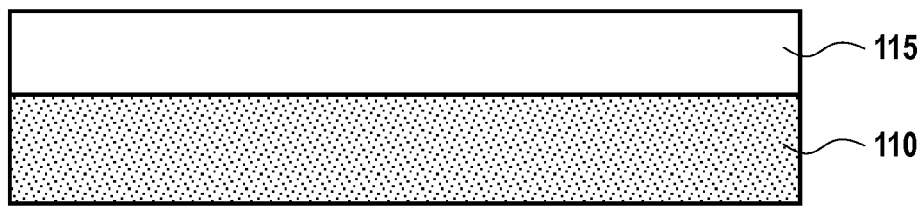

The TFPV solar cell illustrated in FIG. 1 may be formed according to the flowchart of FIG. 2. The flowchart of FIG. 2 will be described in coordination with the process flow illustrated in FIGS. 3A-3E. In block 201 of this flowchart a TCO film is deposited onto a transparent substrate 110 of FIG. 3A, which in one particular embodiment may be float glass. One surface of the float glass may be doped with an element or compound to control the index of reflection of the glass. Dopants that may be used in the float glass include tin (Sn), fluorine (F), boron (B), and various forms of titanium oxide ($Ti_xO_y$). FIG. 3B shows the as-deposited TCO film 115 on the transparent substrate 110. In one embodiment, the TCO may be zinc oxide (ZnO) doped with different dopants (B, Al, Ga, In). Doped ZnO is the one candidate for the TCO front contact window due to its high optical transmittance, high electrical conductivity, and high resistance to hydrogen plasma that is needed for the silicon layer deposition following TCO deposition and texturing. In alternative embodiments the TCO may be other materials such as indium doped tin oxide (ITO), flourine doped tin oxide (FTO), and aluminum doped zinc oxide (AZO.) The TCO may be deposited by methods such as sputtering, thermal evaporation, spray pyrolosis, physical vapor deposition (PVD), or chemical vapor deposition (CVD). The thickness of the TCO layer may be in the approximate range of 0.5 um and 2.0 um, but may be deposited to any thickness sufficient to provide enough TCO material for the texture etch process. A portion of the as-deposited TCO 115 will be sacrificial because the TCO 115 is etched as part of the texturing process. Embodiments of the current invention may provide etching formulations and methodologies that could minimize the amount of TCO etched to thereby reduce solar cell manufacturing cost.

At block 202 of the flowchart of FIG. 2, an optional passivation surface modifier pre-treatment can be performed. The passivation surface modifier may be a silane based material dissolved into an organic solvent in various concentrations. Examples of silane based materials include: n-octadecyldimethylmethoxysilane, 2-(methoxypolyethylyneoxy)-propyl)trimethoxysilane, n-octyldimethylchlorosilane, n-octadecyldimethyl(dimethylamino)silane, (tridecafluoro-1,1,2,2-tetrahydrodecyl)triethoxysilane, 3-mercaptopropyltrimethoxysilane, 3-(N,N-diemethylaminopropyl)trimethoxysilane, and 3-aminopropyltriethoxysilane. Without being bound by theory, it is speculated that the passivation surface modifier forms islands on the surface of the TCO that serve as an etchant mask during the subsequent wet etching process as will be described below. This masking may be used to control the pattern of the texture formed on the surface of the TCO.

Figure 3C:
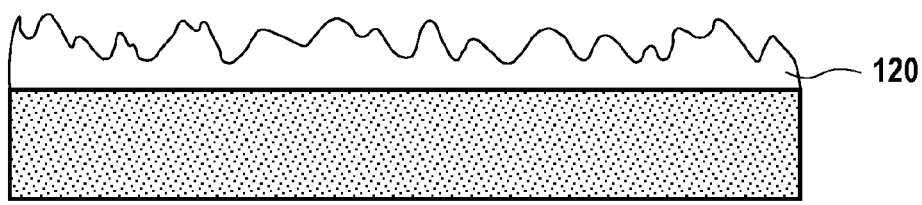

At block 103 of the flowchart of FIG. 2 the TCO surface is textured by a wet etch using an embodiment of a texturing formulation according to an embodiment of the current invention. FIG. 3C illustrates a textured TCO 120. In one embodiment, the surface texturing may be performed by a texturing formulation that is an aqueous solution of an organic acid. In one particular embodiment, the organic acid is selected from the hydroxyl carboxylic acid family which includes carboxylic acids possessing 1-3 hydroxyl groups, such as glycolic acid, lactic acid, malonic acid, succinic acid, adipic acid, malic acid, tartaric acid, and citric acid. In particular embodiments, the acids selected from this family of hydroxyl carboxylic acids for TCO texturing are glycolic acid and citric acid. In other embodiments, the organic acid may be any of the following: 2-hydroxypropanoic acid, 2,3-dihydroxysuccinic acid, ethanedioic acid, amidosulphonic acid, 2-propyl methanesulphonate, methanecarboxylic acid, a-hydroxyacetic acid, 3-hydroxypentanedioic acid, trifluoroethanoic acid, trifluoroethanoic acid, 2-hydroxybenzoic acid, aminoethanoic acid. The acid concentration in the aqueous solution can be within the range of 10 mM-1.0 M. The temperature for the wet etch process can be within the range of 10° C.-80° C., with more particularly in the range of 20° C.-70° C. The time duration for the texture etch can be in the range of 5 seconds to 30 minutes, with a more particular duration of 15 seconds to 10 minutes depending on the organic acid concentration and the temperature of the texturing formulation. Another parameter that may be varied is rotations per minute (rpm) at which the texturing formulation is stirred within the etch bath. Additionally, the texturing formulation itself may be varied by incorporating additives into the texturing formulation. In one embodiment the additive may be an organic solvent. Other additives to the texturing formulation can include surfactants, including anionic, cationic, and polymeric surfactants. In one embodiment, the passivating surface modifiers mentioned above for the pre-treatment may be mixed into the texturing formulation as a surfactant additive.

In another embodiment, the texturing formulation is formed of mixed acids. This embodiment of texturing formulation is formed by mixing a strong etch acid with a surface-passivating acid in order to control the etch depth while achieving good light-scattering capability. The strong etch acids include hydrochloric acid, sulfuric acid, phosphoric acid ($H_3PO_4$), nitric acid, formic acid, acetic acid, trifluoroacetic acid, sulfamic acid, methanesulfonic acid, and any acid that does not form surface passivation on a ZnO surface. The surface-passivating acid may be any of the hydroxyl carboxylic acids mentioned above or an organic acid that can form a surface precipitation or passivation layer with ZnO, such as oxalic acid, and the derivatives of various benzenesulfonic acids. The preferred strong etch acids include hydrochloric acid, sulfuric acid, and phosphoric acid; the preferred surface-passivating acids include oxalic acid, lactic acid, and tartaric acid. The acid concentration range, the etch bath temperature, and the etch duration are the same as mentioned above for the hydroxyl carboxylic acid etch alone.

In another embodiment, in addition to the separate texture etch mentioned above, a multi-step etch combining the above two family of acids can be envisaged where the outcome of optimal light-trapping performance coupled to minimal ZnO material use could be tuned by the selection of the etchants and parameters. This could translate into improved performance at a much reduced manufacturing cost.

Figure 3D:
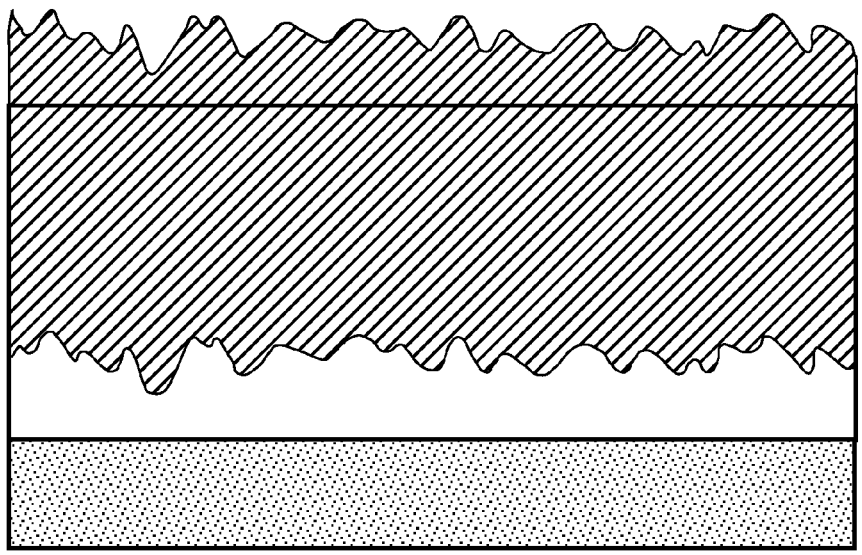
Figure 3E:
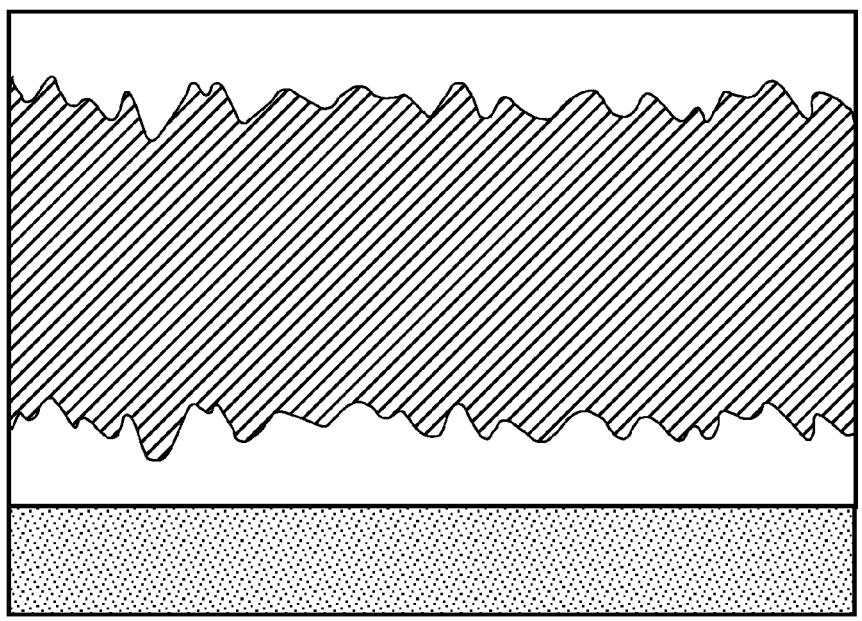

In an embodiment, the method may include an optional post-texture etch wet cleaning using an alkaline solution at block 104 of the flowchart in FIG. 2. The formation of the silicon thin film stack and the back-contact deposition may then be completed at block 105 of the flowchart of FIG. 2. In FIG. 3D a silicon layer 130 is deposited to serve as the optical conversion layer where light is transformed into electrical energy. A single layer of silicon 130 is shown for purposes of demonstration, but it is to be understood that the silicon layer 130 may be multiple layers or junctions of silicon of various types such as crystalline silicon, polycrystalline silicon, or amorphous silicon. In FIG. 3E, the deposition of a back contact electrode 140 completes the basic solar cell 100. The back contact electrode 140 may be a metal or any such conductive material.

Experimental Data

Figure 4:
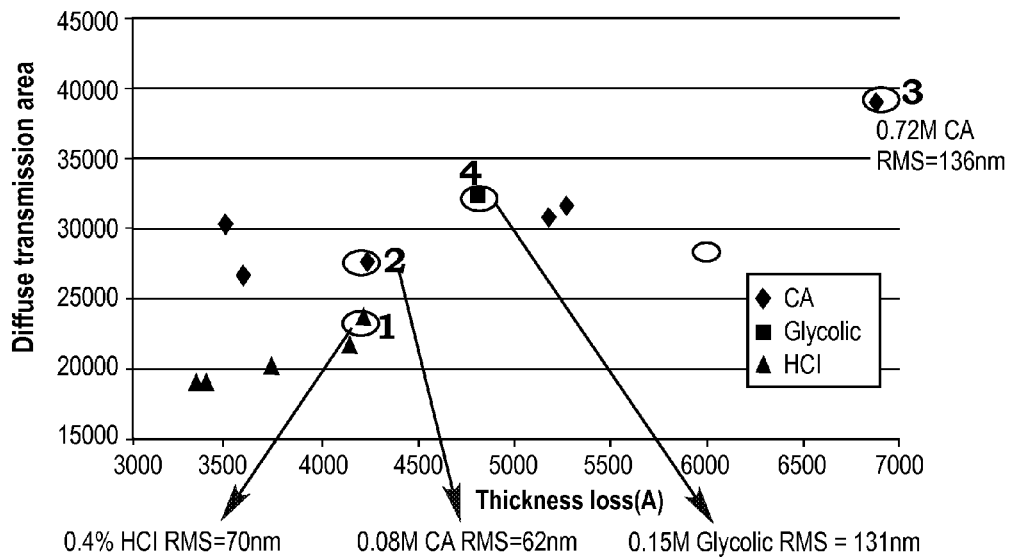
FIG. 4 is a graph plotting thickness loss (in angstroms) on the x-axis vs. the diffuse transmission area on the y-axis for multiple TCO films textured by different texturing formulations.
Figure 5:
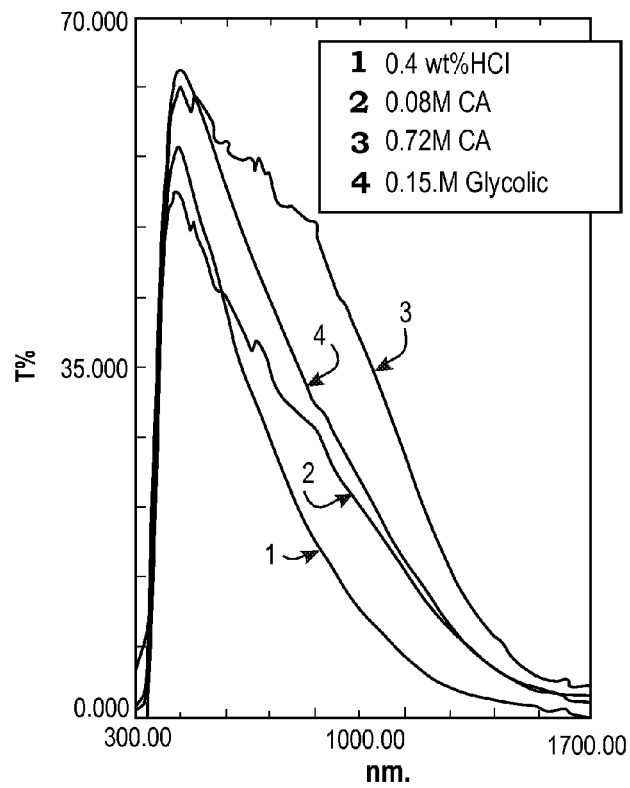
FIG. 5 is a graph plotting the wavelength of light (nm) on the x-axis vs. the percent transmittance on the y-axis for multiple TCO films textured by different texturing formulations.
Figure 6:
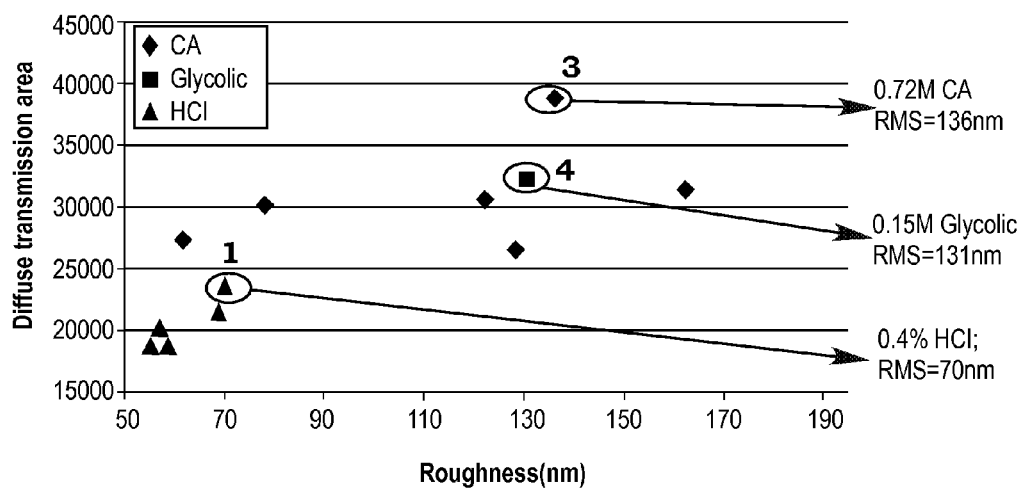
FIG. 6 is a graph plotting the roughness (nm) on the x-axis vs. the diffuse transmission area on the y-axis for multiple TCO films textured by different texturing formulations.

In one embodiment, texturing formulations including the hydroxyl carboxylic acids glycolic acid (glycolic) and citric acid (CA) were used to texture zinc oxide (ZnO) TCO films. The texturing formulations including glycolic acid or citric acid may provide a higher light scattering intensity of the etched TCO 120 as compared to HCl-based texturing formulations. In FIGS. 4-6, the light scattering capabilities of ZnO TCO films having a starting thickness in the approximate range of 12000 angstroms to 13000 angstroms and deposited on float glass as textured by formulations including glycolic acid, citric acid, or HCl are measured by the diffuse transmittance using an integrating sphere. FIG. 4 is a graph plotting thickness loss (in angstroms) on the x-axis vs. the diffuse transmission area on the y-axis. The specific root means square (rms) roughness is provided for several of the points on the graph of FIG. 4 to provide further information on the particular etchant formulation results. The data point labeled 1 represents an aqueous texturing formulation including 0.4 weight percent of HCl. Data point 2 represents an aqueous texturing formulation including 0.08 M citric acid. Data point 3 represents an aqueous texturing formulation including 0.72 M citric acid. Data point 4 represents an aqueous texturing formulation including 0.15 M glycolic acid. This graph illustrates that the diffuse transmission with a citric acid-based texturing formulation is more than 25% greater than for an HCl-based texturing formulation at a similar TCO thickness loss range.

FIG. 5 is a graph plotting the wavelength of light (nm) on the x-axis vs. the percent transmittance on the y-axis. FIG. 5 plots data collected for the same texturing formulations highlighted in FIG. 4 as used on ZnO TCO films deposited on float glass and having a starting thickness in the approximate range of 12000 angstroms to 13000 angstroms. FIG. 5 illustrates the broadening of the diffused spectrum by the citric acid-based texturing formulations 2 and 3 at higher wavelengths. The broadening of the diffused spectrum indicates improved light trapping and light scattering. FIG. 6 illustrates a graph plotting the roughness (nm) on the x-axis vs. the diffuse transmission area on the y-axis. The results for the aqueous texturing formulations 1, 3 and 4 including, respectively, 0.4 weight percent HCl, 0.72 M citric acid, and 0.15 M glycolic acid are plotted in the graph of FIG. 6. This graph shows that texturing formulation 2 (citric acid-based) and formulation 3 (glycolic acid-based) textured ZnO TCO films have a higher roughness and a higher diffuse transmission. This translates to improved light scattering and light trapping.

Although the foregoing examples have been described in some detail for purposes of clarity of understanding, the invention is not limited to the details provided. There are many alternative ways of implementing the invention. The disclosed examples are illustrative and not restrictive.

What is claimed:

1. A method of texturing a transparent conductive oxide (TCO) layer, comprising
   providing a substrate comprising a TCO;
   applying a texturing formulation to the substrate to texture the TCO, and
   using the texturing formulation to etch the TCO such that the etched TCO exhibits increased light scattering,
   wherein the texturing formulation comprises
      a surface passivating acid and
      a passivation surface modifier selected from
         n-octadecyldimethylmethoxysilane,
         2-(methoxypolyethylyneoxy)-propyl)trimethoxysilane,
         n-octyldimethylchlorosilane, noctadecyldimethyl(dimethylamino)silane, (tridecafluoro-1,1,2,2- tetrahydrodecyl)triethoxysilane,
         3-mercaptopropyltrimethoxysilane,
         3-(N,N-dimethylaminopropyl)trimethoxysilane, or
         3-aminopropyltriethoxysilane.

2. The method of claim 1, wherein the TCO comprises zinc oxide and the substrate comprises float glass.

3. The method of claim 1, wherein applying the texturing formulation comprises applying the formulation at a temperature in an approximate range of 20° C. -70° C. and for a time in the range of 15 seconds to 10 minutes.

4. The method of claim 1, further comprising a pretreatment step with a passivation surface modifier before applying the texturing formulation.

5. The method of claim 1, wherein the texturing formulation further comprises a strong acid.

6. The method of claim 1, further comprising a post texture etch wet cleaning using an alkaline solution.

7. The method of claim 1, wherein the surface passivating acid is an organic acid that can form a surface precipitation or passivation layer with ZnO.

8. The method of claim 1, wherein the surface passivating acid comprises a hydroxyl carboxylic acid having between one and three hydroxyl groups, oxalic acid, or benzenesulfonic acid and its derivatives.

9. The method of claim 1, wherein, after etching, the TCO layer can function as a continuous front contact electrode for a thin film photovoltaic device and provides enhanced light trapping in the thin film photovoltaic device.

10. The method of claim 4, wherein the passivation surface modifier comprises a silane surfactant.

11. The method of claim 10, wherein the passivation surface modifier is selected from n-octadecyldimethylmethoxysilane, 2-(methoxypolyethylyneoxy)-propyl)trimethoxysilane, n-octyldimethylchlorosilane, n-octadecyldimethyl(dimethylamino)silane, (tridecafluoro-1,1,2,2-tetrahydrodecyl)triethoxysilane, 3-mercaptopropyltrimethoxysilane, 3-(N,Ndiemethylaminopropyl)trimethoxysilane, or 3-aminopropyltriethoxysilane.

12. The method of claim 1, wherein the texturing formulation further comprises an organic solvent.

13. The method of claim 1, wherein the texturing formulation further comprises a cationic, anionic, or polymeric surfactant.

14. The method of claim 5, wherein the strong acid is selected from hydrochloric acid, sulfuric acid, phosphoric acid ($H_3PO_4$), nitric acid, formic acid, acetic acid, trifluoacetic acid, sulfamic acid, or methanesulfonic acid.

15. The method of claim 1, wherein after etching with the texturing formulation, the diffuse transmission through the TCO is more than 25% greater when treated with the texturing formulation than when treated with a texturing formulation comprising 0.4 wt.% at a similar TCO thickness loss range.

16. The method of claim 1, wherein after etching with the texturing formulation, the diffused spectrum through the TCO exhibits broadening when treated with the texturing formulation relative to treatment with a texturing formulation comprising 0.4 wt.% HCl.

* * * * *